United States Patent
Morimoto et al.

(10) Patent No.: US 6,967,119 B2
(45) Date of Patent: Nov. 22, 2005

(54) SEMICONDUCTOR LASER DEVICE AND METHOD OF FABRICATING THE SAME

(75) Inventors: Taiji Morimoto, Nara (JP); Keisuke Miyazaki, Ikoma (JP); Masaki Tatsumi, Tenri (JP); Kazuhiko Wada, Yamatokoriyama (JP); Yoshiaki Ueda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/699,553

(22) Filed: Oct. 31, 2003

(65) Prior Publication Data

US 2004/0089873 A1 May 13, 2004

(30) Foreign Application Priority Data

Oct. 31, 2002 (JP) .......................................... 2002-318292

(51) Int. Cl.⁷ ................................................ H01L 21/00
(52) U.S. Cl. ............................ 438/46; 438/77; 438/85; 438/93
(58) Field of Search ............................. 438/46, 77, 93, 438/85, 956

(56) References Cited

U.S. PATENT DOCUMENTS

| | | | | |
|---|---|---|---|---|
| 2001/0021209 A1 | * | 9/2001 | Onishi | ........................ 372/43 |
| 2002/0041148 A1 | * | 4/2002 | Cho et al. | .................... 313/499 |
| 2003/0194823 A1 | | 10/2003 | Miyasaki et al. | ............. 438/22 |

FOREIGN PATENT DOCUMENTS

| | | | | |
|---|---|---|---|---|
| JP | 1-204487 | | 8/1989 | ............. H01S/3/18 |
| JP | 10-229249 | * | 8/1998 | ............. H01S/3/18 |
| JP | 2001-57462 | | 2/2001 | ........... H01S/5/323 |
| JP | 2001-244572 | | 9/2001 | ............. H01S/5/22 |

* cited by examiner

*Primary Examiner*—Hsien Ming Lee
(74) *Attorney, Agent, or Firm*—Morrison & Foerster LLP

(57) ABSTRACT

There is provided a semiconductor laser device having on a single substrate a plurality of laser portions each oscillating laser light of a different wavelength, the plurality of laser portions containing different types, respectively, of dopant. There is also provided a method of fabricating a semiconductor laser device, forming on a single substrate a plurality of laser portions each oscillating laser light of a different wavelength, initially forming a laser portion in a crystal growth method and subsequently forming another laser portion in a different crystal growth method.

13 Claims, 9 Drawing Sheets

SEMICONDUCTOR LASER DEVICE AND METHOD OF FABRICATING THE SAME

BACKGROUND OF THE INVENTION

1. Field of the Invention

The present invention relates generally to semiconductor laser devices and methods of fabricating the same and particularly to monolithic semiconductor laser devices used as a source of light for optical discs of different standards and methods of fabricating the same.

2. Description of Related Art

In recent years, recording media providing enhanced recording densities and reproduction devices therefor are increasingly developed. For example, the digital versatile disc (DVD) is increasingly used in a variety of areas as an optical disc capable of recording/reproducing motion images and an increasing demand therefor in future is expected. Recently, there is an increasing need by users for developing a drive device having a function also capable of recording/reproducing conventional compact discs (CDs).

To implement this drive device there have been proposed a hybrid laser apparatus incorporating in a single package a red laser device of a wavelength of the 600 nm band used to record/reproduce a DVD and an infrared laser device of a wavelength of the 700 nm band used for a laser to record/reproduce a CD, and a monolithic laser device having two laser portions formed on a single substrate to oscillate red laser light of a wavelength of the 600 nm band and infrared laser light of a wavelength of the 700 nm band.

If the hybrid laser apparatus is used for the drive device, however, it is difficult to improve precision of a light emission point, which is an important factor for optional pickup, since the two laser devices are incorporated in the single package. Thus, for the drive device, using a monolithic laser device allowing a highly controllable position of a light emission point is considered effective.

FIG. 11 is a schematic perspective view of a conventional monolithic semiconductor laser device. In FIG. 11, a conventional monolithic semiconductor laser device 500 includes an infrared laser portion 502 having a double hetero structure for CDs and a red laser portion 503 having a double hetero structure for DVDs for a total of two laser portions. Conventional monolithic semiconductor laser device 500 is fabricated as follows: with reference to FIG. 12, initially to form red laser portion 503 an AlGaInP based semiconductor layer is grown. Then outside the growth furnace the AlGaInP based semiconductor layer that has grown in a region other than that to be provided with red laser portion 503 is etched away and subsequently to form infrared laser portion 502 an AlGaAs based semiconductor layer is grown, for example. Herein, the laser portions are both formed by metal-organic chemical vapor deposition (MOCVD) and have p type dopant of zinc (Zn) introduced therein.

In the conventional monolithic semiconductor laser device, however, the laser portion's light emission efficiency can decrease, and in a current-voltage characteristic an abnormality can be caused or a similarly impaired laser characteristic can be provided. In monolithic semiconductor laser devices, in particular, if one laser portion exhibits a poor laser characteristic and the other laser portions present a satisfactory characteristic the entirety of the semiconductor laser device still would be regarded as defective, resulting in decreased production yields.

SUMMARY OF THE INVENTION

Accordingly in view of the above circumstance the present invention contemplates a semiconductor laser device allowing a laser portion to have a satisfactory laser characteristic to provide increased production yield and a method of fabricating the same.

The present invention is a semiconductor laser device having on a single substrate a plurality of laser portions each oscillating laser light of a different wavelength, wherein the plurality of laser portions contain different types, respectively, of dopant.

The present semiconductor laser device allows p type dopant to vary in type for different laser portions.

In that case preferably one laser portion contains p type dopant of zinc (Zn), carbon (C) or magnesium (Mg) and another laser portion contains p type dopant of beryllium (Be).

Furthermore in the present semiconductor laser device preferably one laser portion is formed mainly of an AlGaAs based crystal and another laser portion is formed mainly of an AlGaInP based crystal.

Furthermore the present invention is a method of fabricating a semiconductor laser device, forming on a single substrate a plurality of laser portions each oscillating laser light of a different wavelength, wherein a laser portion previously formed and a laser portion subsequently formed are formed by different crystal growth methods, respectively.

In the present method one of the crystal growth methods employed to form the laser portions can be metal-organic chemical vapor deposition (MOCVD).

Furthermore in the present method one of the crystal growth methods employed to form the laser portions can be molecular beam epitaxy (MBE).

In that case for the laser portion previously formed a crystal can be grown by MBE.

Furthermore in that case preferably the laser portion previously formed contains p type dopant having a diffusion coefficient smaller than that of p type dopant in the laser portion subsequently formed.

Furthermore in that case preferably the laser portion previously formed contains p type dopant of beryllium.

Furthermore in that case preferably the laser portion subsequently formed contains p type dopant of one of zinc, carbon or magnesium.

Furthermore in the present method maximum and minimum temperatures of the substrate in growing a crystal for the laser portion previously formed can respectively be higher than those of the substrate in growing a crystal for the laser portion subsequently formed.

Preferably the minimum temperature of the substrate in growing the crystal for the laser portion previously formed is higher than the maximum temperature of the substrate in growing the crystal for the laser portion subsequently formed.

Furthermore in those cases preferably for the laser portion previously formed a crystal is grown by metal-organic chemical vapor deposition.

Furthermore in those cases preferably the laser portion previously formed contains p type dopant having a diffusion coefficient smaller than that of p type dopant in the laser portion subsequently formed.

Furthermore in the present method the laser portion previously formed can also contain p type dopant of one of zinc, carbon or magnesium.

Preferably the laser portion subsequently formed contains p type dopant of beryllium.

Furthermore in the present method the laser portion previously formed can be formed mainly of an AlGaAs based crystal and the laser portion subsequently formed can be formed mainly of an AlGaInP based crystal.

Furthermore in the present method the laser portion previously formed can be formed mainly of an AlGaInP based crystal and the laser portion subsequently formed can be formed mainly of an AlGaAs based crystal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
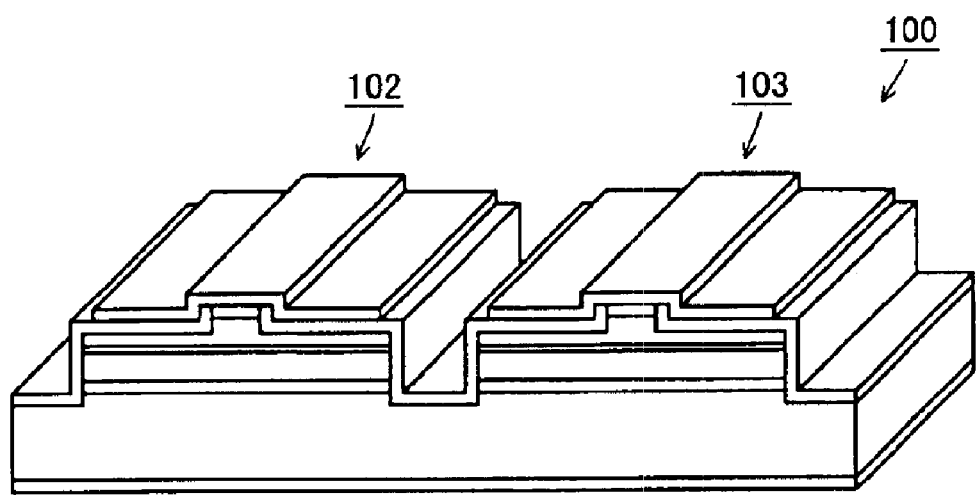
FIG. 1 is a schematic perspective view of a semiconductor laser device of a first embodiment.

In fabricating a monolithic semiconductor laser device having a plurality of laser portions a laser portion that is formed previously (hereinafter referred to as a "first laser portion") is again heated when a laser portion that is subsequently formed (hereinafter referred to as a "second laser portion") is grown.

In general, these laser portions are formed by MOCVD. MOCVD, however, requires that a substrate have a relatively high temperature. Accordingly, as the first laser portion is again heated in forming the second laser portion, Zn, C or a similar p type dopant that readily diffuse that is contained in the first laser portion would leap out of the first laser portion's p type semiconductor layer, diffusing as far as an active layer and an n type semiconductor layer. Generally, a dopant concentration in a semiconductor layer is precisely designed. If dopant diffuses into a different layer, as described above, the first laser portion's reduced light emission efficiency or a similarly impaired laser characteristic is unavoidable. The present inventors have found that such causes the first laser portion's reduced light emission efficiency and other, similarly impaired laser characteristics and hence reduced semiconductor laser production yields.

Accordingly the present inventors considered that if in forming the second laser portion the first laser portion again heated can be prevented from having its dopant diffusing within the first laser portion, the first laser portion can have a satisfactory laser characteristic and as a result increased semiconductor laser device production yields can be provided. The present inventors have thus arrived at the present invention.

The present invention is a semiconductor laser device in which a plurality of laser portions formed on a single substrate contains different types, respectively, of dopant. Different types of dopant diffuses in a semiconductor layer differently. As such, if the first laser portion has dopant of a small diffusion coefficient introduced therein the first laser portion's dopant diffusion can effectively be reduced.

In that case as the first laser portion's p type dopant Be is preferably used and furthermore as the second laser portion's p type dopant Zn, C or Mg is more preferably used, since Be, having a diffusion coefficient smaller than Zn, C and Mg, can prevent the first laser portion from having significant diffusion, and these types of dopant also allow a laser portion to have a more satisfactory laser characteristic.

Furthermore in this case preferably the first laser portion is formed by molecular beam epitaxy (MBE) and furthermore, more preferably the second laser portion is formed by MOCVD. If the first laser portion's p type dopant is Be and a crystal is grown by MBE, purity of source gas containing Be and other similar issues need not be addressed, and the dopant is congenial to the crystal growth method, and the first laser portion's p type semiconductor layer can be more satisfactory. Furthermore if the second laser portion's p type dopant is Zn, C or Mg and a crystal is grown by MOCVD, the dopant is also congenial to the crystal growth method, and the second laser portion's p type semiconductor layer can further be satisfactory.

Furthermore, the first laser portion's p type dopant can be Zn, C or Mg, and furthermore the second laser portion's p type dopant can be Be. In that case, the first laser portion will have dopant of a larger diffusion coefficient introduced therein. However, by forming the second laser portion by a method capable of growing a crystal with a substrate having a relatively low temperature, the first laser portion's dopant diffusion can more effectively be reduced.

Furthermore in this case preferably the first laser portion is formed by MOCVD and furthermore, more preferably the second laser portion is formed by MBE. If the first laser portion's p type dopant is Zn, C or Mg and a crystal is grown by MOCVD, the dopant is congenial to the crystal growth method, and the first laser portion's p type semiconductor layer can be more satisfactory. Furthermore if the second laser portion's p type dopant is Be and a crystal is grown by MBE, the dopant is also congenial to the crystal growth method, and the second laser portion's p type semiconductor layer can further be satisfactory.

Furthermore, preferably one of the first and second laser portions is formed mainly of an AlGaAs based crystal and the other laser portion is formed mainly of an AlGaInP based crystal, since the laser portion formed mainly of an AlGaAs based crystal oscillates infrared laser light of a wavelength of the 700 nm band to the 800 nm band, which is suitable for recording/reproducing CDs, and the laser portion formed mainly of an AlGaInP based crystal oscillates red laser light of a wavelength of the 600 nm band, which is suitable for recording/reproducing DVDs. Note that throughout the specification an "AlGaAs based crystal" refers to a crystal mainly containing aluminum (Al), gallium (Ga) and arsenic (As) and an "AlGaInP based crystal" refers to a crystal mainly containing aluminum (Al), gallium (Ga), indium (In) and phosphorus (P).

Furthermore the present invention is a method of fabricating a semiconductor laser device that forms first and second laser portions by different crystal growth methods, respectively. More specifically, the second laser portion can be formed by a method capable of growing a crystal with a substrate having a relatively low temperature to effectively reduce the first laser's dopant diffusion. For example, the first laser portion can be formed by MOCVD allowing crystal growth with a substrate having a relatively high temperature and the second laser portion can be formed by MBE allowing crystal growth with the substrate having a relatively low temperature to effectively reduce the first laser portion's dopant diffusion.

In particular, preferably the substrate's maximum temperature in the first laser portion's crystal growth is higher than that in the second laser portion's crystal growth and the substrate's minimum temperature in the first laser portion's crystal growth is higher than that in the second laser portion's crystal growth. Furthermore more preferably the substrate's minimum temperature in the first laser portion's crystal growth is higher than the substrate's maximum temperature in the second laser portion's crystal growth. Furthermore in the above more preferably the first laser portion contains p type dopant having a diffusion coefficient smaller than that of p type dopant in the second laser portion. These cases tend to allow the first laser portion to have a higher performance laser characteristic.

Furthermore, the first laser portion can be formed by a method allowing crystal growth with a substrate having a relatively low temperature and the second laser portion can be formed by a method allowing crystal growth with the substrate having a relatively high temperature, although this entails introducing as the first laser portion's dopant Be or a similar dopant having a small diffusion coefficient to reduce the first laser portion's dopant diffusion.

Furthermore the substrate's temperature suitable for crystal growth depends on the method of crystal growth of interest. For example, when MOCVD is employed to grow a crystal the substrate preferably has a temperature of no less than 600° C. to no more than 800° C., more preferably no less than 640° C. to no more than 800° C. When MBE is employed to grow a crystal the substrate preferably has a temperature of no less than 400° C. to less than 600° C., more preferably no less than 450° C. to less than 600° C.

First Embodiment

With reference to FIG. 1, initially an infrared laser portion 102 formed mainly of an AlGaAs based crystal (for CDs) (with p type dopant of Zn) is formed by MOCVD and then a red laser portion 103 formed mainly of an AlGaInP based crystal (for DVDs) (with p type dopant of Be) is formed by MBE to provide a semiconductor laser device 100, shown in a schematic perspective view.

Figure 2A:
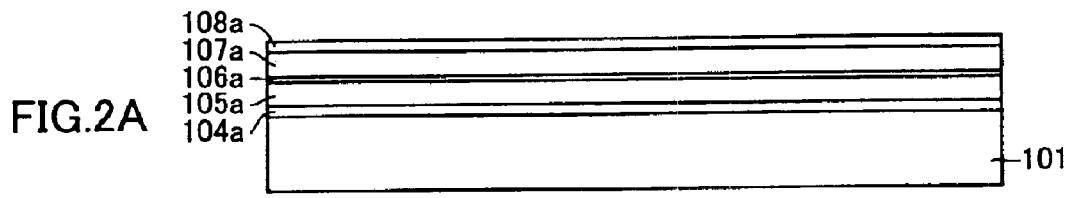
FIGS. 2A–2F are schematic cross sections illustrating a process for fabricating the semiconductor laser device of the first embodiment.

Semiconductor laser device 100 is fabricated as follows: initially, as shown in FIG. 2A, on an n type GaAs substrate 101 MOCVD is employed to grow in order a Si doped (dopant concentration: $1\times10^{18}$ cm$^{-3}$), n type GaAs buffer layer 104a having a thickness of 0.5 $\mu$m, a Si doped (dopant concentration: $1\times10^{18}$ cm$^{-3}$), n type AlGaAs clad layer 105a having a thickness of 1.5 $\mu$m, an active layer 106a having a quantum well structure, a Zn doped (dopant concentration: $2\times10^{18}$ cm$^{-3}$), p type AlGaAs clad layer 107a having a thickness of 1.5 $\mu$m, and a Zn doped (dopant concentration: $5\times10^{18}$ cm$^{-3}$), p type GaAs cap layer 108a having a thickness of 0.5 $\mu$m. Note that active layer 106a is formed of a well layer and a barrier layer deposited alternately. For example, three nondoped GaAs well layers each having a thickness of 10 nm and four nondoped AlGaAs barrier layers each having a thickness of 10 nm are deposited such that one type of layer is deposited on the other type of layer. Note that the above semiconductor layers are grown under a condition allowing the substrate to have a temperature of no less than 600° C. to no more than 800° C.

Figure 2B:
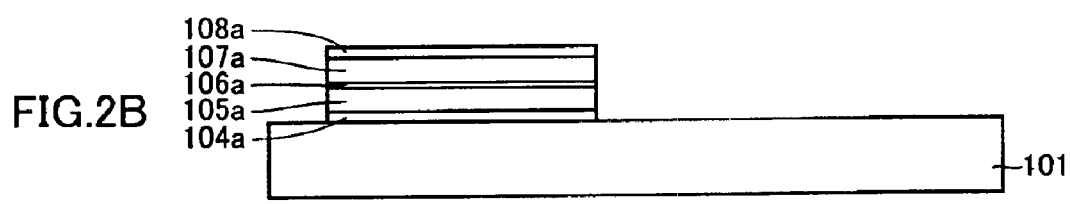

Then, with reference to FIG. 2B, outside the growth furnace the semiconductor layers thus grown are partially etched away to partially expose a surface of substrate 101.

Figure 2C:
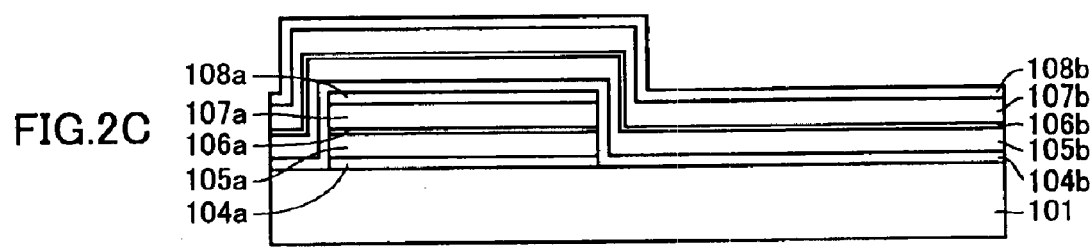

Then, as shown in FIG. 2C, MBE is employed to grow on substrate 101 a Si doped (dopant concentration: $1\times10^{18}$ cm$^{-3}$), n type GaAs buffer layer 104b having a thickness of 0.5 $\mu$m, a Si doped (dopant concentration: $1\times10^{18}$ cm$^{-3}$), n type AlGaInP clad layer 105b having a thickness of 1.5 $\mu$m, an active layer 106b having a quantum well structure, a Be doped (dopant concentration: $2\times10^{18}$ cm$^{-3}$), p type AlGaInP clad layer 107b having a thickness of 1.5 $\mu$m, and a Be doped (dopant concentration: $5\times10^{18}$ cm$^{-3}$), p type GaAs cap layer 108b having a thickness of 0.5 $\mu$m, in order. Note that active layer 106b is formed of a well layer and a barrier layer deposited alternately. For example, three nondoped GaInP well layers each having a thickness of 10 nm and four nondoped AlGaInP barrier layers each having a thickness of 10 nm are deposited such that one type of layer is deposited on the other type of layer. Note that the semiconductor layers are grown under a condition allowing the substrate to have a temperature of no less than 400° C. to less than 600° C.

Figure 2D:
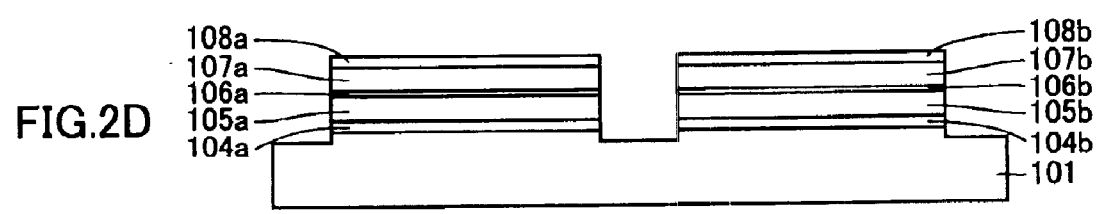

Then, as shown in FIG. 2D, again on substrate 101 the semiconductor layers are partially etched away to partially expose a surface of substrate 101.

Figure 2E:
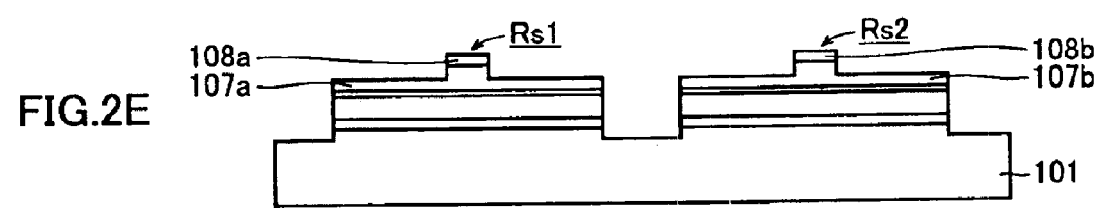

Then, as shown in FIG. 2E, clad layer 107a and cap layer 108a, and clad layer 107b and cap layer 108b are partially etched away to form ridges Rs1 and Rs2.

Figure 2F:
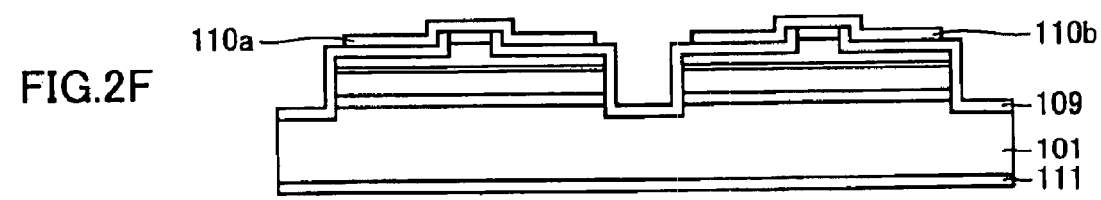

Then, as shown in FIG. 2F, to prevent a current from flowing in from other than ridges Rs1 and Rs2, an insulation film 109 of silicon nitride is provided, on ridges Rs1 and Rs2 insulation film 109 is partially removed, and p type electrodes 110a, 110b are then formed. P type electrodes 110a, 110b are formed for example of an AuZn layer, a Mo layer and an Au layer deposited in order. More specifically, the electrodes are formed by partially etching away the metal layers for the p type electrodes to prevent short circuit between the two laser portions. Furthermore, an n type electrode 111 is provided on substrate 101 at a back surface, i.e., a surface opposite to that for crystal growth. N type electrode 111 is formed for example of an AuGe layer, a Ni layer, a Mo layer and an Au layer deposited in order.

Figure 3:
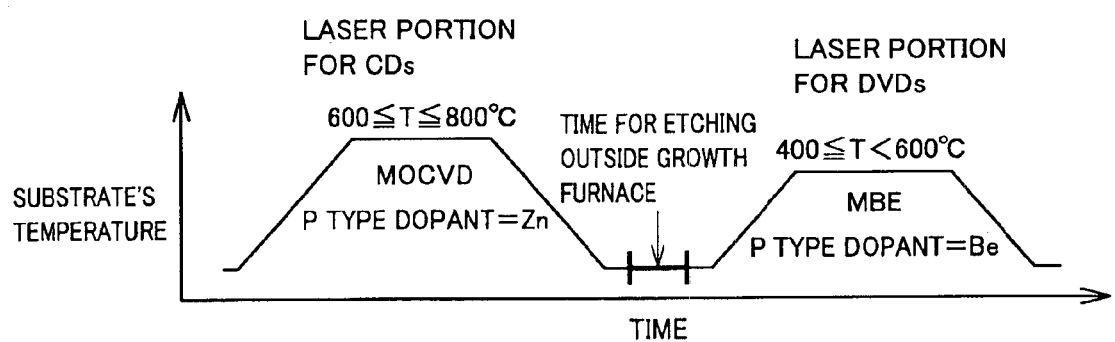
FIG. 3 represents a relationship between time and a substrate's temperature in the process for fabricating the semiconductor laser device of the first embodiment.

As shown in FIG. 3, in the first embodiment, initially a laser portion for CDs is formed by MOCVD and subsequently that for DVDs is formed by MBE with the substrate having a lower temperature. This, as compared with forming both laser portions by MOCVD with the substrate having a high temperature, as conventional, can reduce diffusion of Zn corresponding to p type dopant in the laser portion for CDs. The semiconductor laser device's threshold current, operating current and the like can be reduced, providing increased light emission efficiency.

Second Embodiment

In a second embodiment a semiconductor laser device having the same structure as that in the first embodiment shown in FIG. 1 is fabricated by a method different from that employed in the first embodiment.

The second embodiment is characterized in that a laser portion (with p type dopant of Be) for DVDs is initially formed by MBE and a laser portion (with p type dopant of Zn) for CDs is then formed by MOCVD.

Figure 4A:
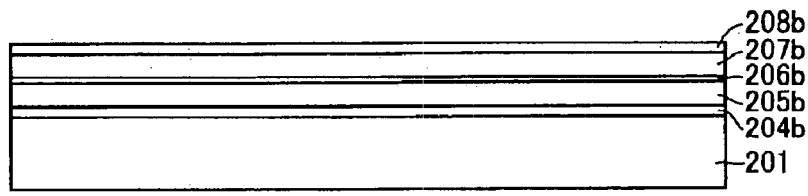
FIGS. 4A–4F are schematic cross sections illustrating a process for fabricating the semiconductor laser device of a second embodiment.

More specifically, initially with reference to FIG. 4A, on an n type GaAs substrate 201 MBE is employed to grow in order a Si doped (dopant concentration: $1 \times 10^{18}$ cm$^{-3}$), n type GaAs buffer layer 204b having a thickness of 0.5 µm, a Si doped (dopant concentration: $1 \times 10^{18}$ cm$^{-3}$), n type AlGaInP clad layer 205b having a thickness of 1.5 µm, an active layer 206b having a quantum well structure, a Be doped (dopant concentration: $2 \times 10^{18}$ cm$^{-3}$), p type AlGaInP clad layer 207b having a thickness of 1.5 µm, and a Be doped (dopant concentration: $5 \times 10^{18}$ cm$^{-3}$), p type GaAs cap layer 208b having a thickness of 0.5 µm. Note that active layer 206b is formed of a well layer and a barrier layer deposited alternately. For example, three nondoped GaInP well layers each having a thickness of 10 nm and four nondoped AlGaInP barrier layers each having a thickness of 10 nm are deposited such-that one type of layer is deposited on the other type of layer. Note that the above semiconductor layers are grown under a condition allowing the substrate to have a temperature of no less than 400° C. to less than 600° C.

Figure 4B:
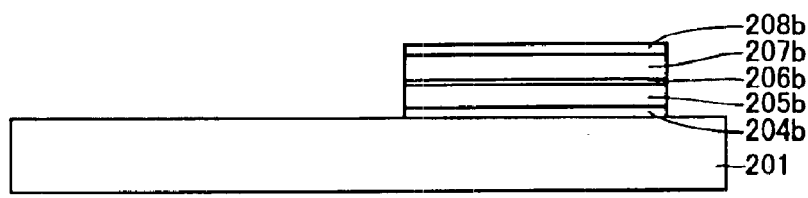

Then, with reference to FIG. 4B, outside the growth furnace the semiconductor layers thus grown are partially etched away to partially expose a surface of substrate 201.

Figure 4C:
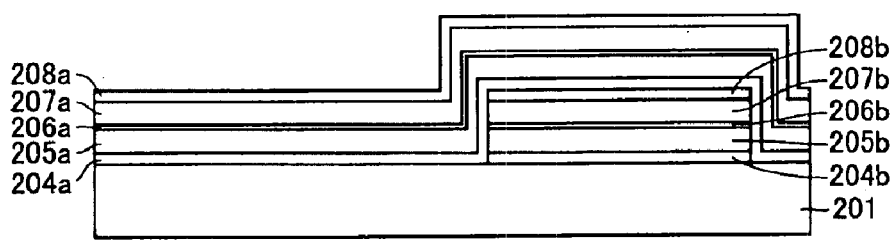

Then, as shown in FIG. 4C, MOCVD is employed to grow on substrate 201 a Si doped (dopant concentration: $1 \times 10^{18}$ cm$^{-3}$), n type GaAs buffer layer 204a having a thickness of 0.5 µm, a Si doped (dopant concentration: $1 \times 10^{18}$ cm$^{-3}$), n type AlGaAs clad layer 205a having a thickness of 1.5 µm, an active layer 206a having a quantum well structure, a Zn doped (dopant concentration: $2 \times 10^{18}$ cm$^{-3}$), p type AlGaAs clad layer 207a having a thickness of 1.5 µm, and a Zn doped (dopant concentration: $5 \times 10^{18}$ cm$^{-3}$), p type GaAs cap layer 208a having a thickness of 0.5 µm, in order. Note that active layer 206a is formed of a well layer and a barrier layer deposited alternately. For example, three nondoped GaAs well layers each having a thickness of 10 nm and four nondoped AlGaAs barrier layers each having a thickness of 10 nm are deposited such that one type of layer is deposited on the other type of layer. Note that the semiconductor layers are grown under a condition allowing the substrate to have a temperature of no less than 600° C. to no more than 800° C.

Figure 4D:
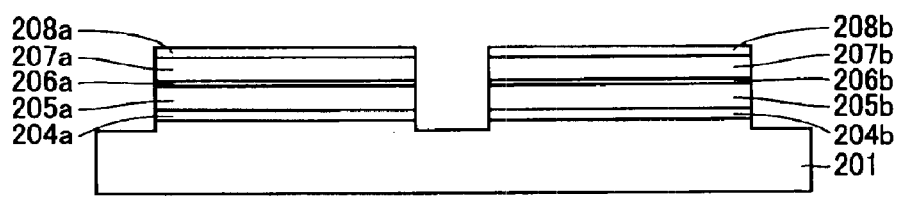

Then, as shown in FIG. 4D, again on substrate 201 the semiconductor layers are partially etched away to partially expose a surface of substrate 201.

Figure 4E:
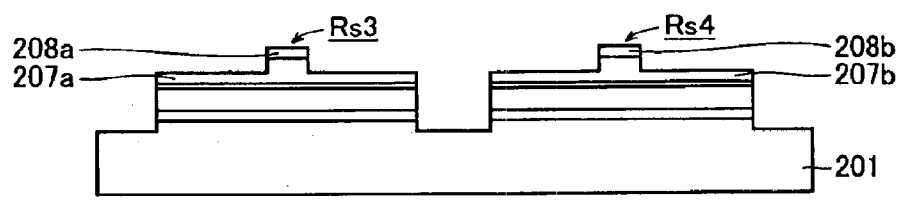

Then, as shown in FIG. 4E, clad layer 207a and cap layer 208a, and clad layer 207b and cap layer 208b are partially etched away to form ridges Rs3 and Rs4.

Figure 4F:
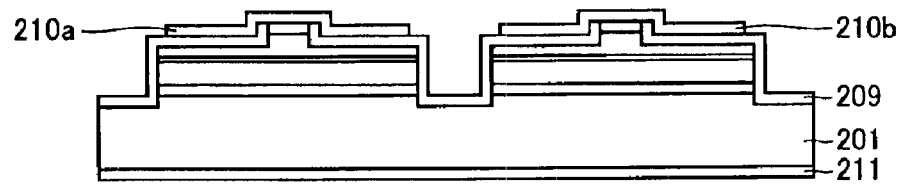

Then, as shown in FIG. 4F, to prevent a current from flowing in from other than ridges Rs3 and Rs4, an insulation film 209 of silicon nitride is provided, on ridges Rs3 and Rs4 insulation film 209 is partially removed, and p type electrodes 210a, 210b are then formed. P type electrodes 210a, 210b are formed for example of an AuZn layer, a Mo layer and an Au layer deposited in order. More specifically, the electrodes are formed by partially etching away the metal layers for the p type electrodes to prevent short circuit between the two laser portions. Furthermore, an n type electrode 211 is provided on substrate 201 at a back surface, i.e., a surface opposite to that for crystal growth. N type electrode 211 is formed for example of an AuGe layer, a Ni layer, a Mo layer and an Au layer deposited in order.

Figure 5:
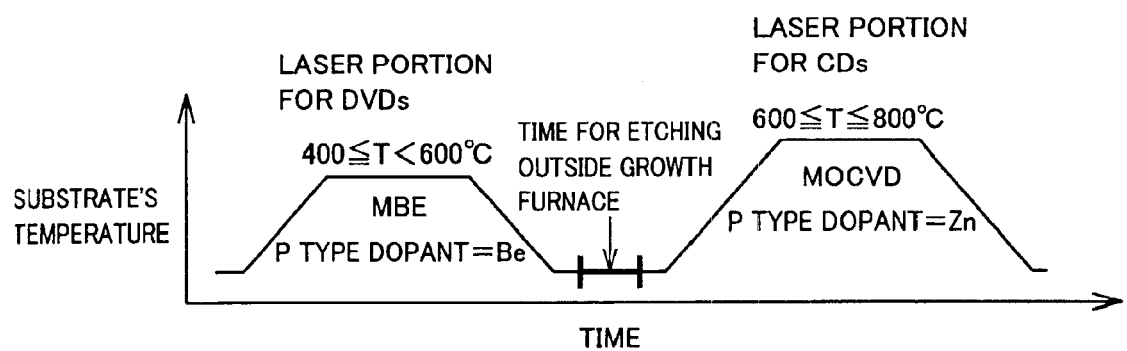
FIG. 5 represents a relationship between time and a substrate's temperature in the process for fabricating the semiconductor laser device of the second embodiment.

As shown in FIG. 5, in the second embodiment when the laser portion for CDs is subsequently formed the substrate has a temperature higher than when the laser portion for DVDs is initially formed. However, as the initially formed laser portion for DVDs has p type dopant having a small diffusion coefficient, Be, introduced therein, the dopant's diffusion can be reduced. This, as compared with doping the laser portions with p type dopant of Zn, as conventional, can reduce the semiconductor laser device's threshold current, operating current and the like, providing increased light emission efficiency.

Third Embodiment

Figure 6:
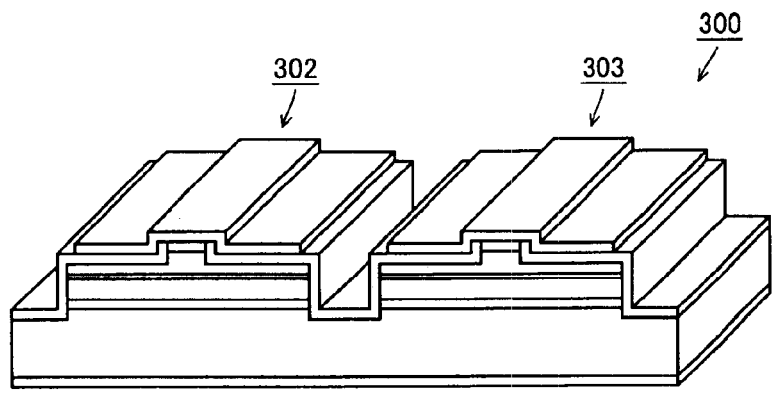
FIG. 6 is a schematic, perspective view of the semiconductor laser device of a third embodiment.

With reference to FIG. 6, initially an infrared laser portion 302 formed mainly of an AlGaAs based crystal (for CDs) (with p type dopant of Be) is formed by MBE and then a red laser portion 303 formed mainly of an AlGaInP based crystal (for DVDs) (with p type dopant of Zn) is formed by MOCVD to provide a semiconductor laser device 300, shown in a schematic perspective view.

Figure 7A:
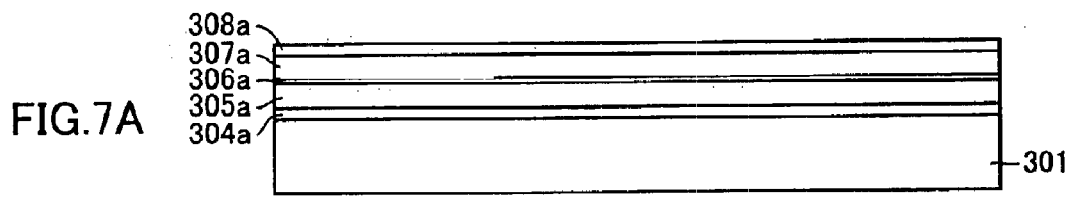
FIGS. 7A–7F are schematic cross sections illustrating a process for fabricating the semiconductor laser device of the third embodiment.

Semiconductor laser device 300 is fabricated as follows: initially, as shown in FIG. 7A, on an n type GaAs substrate 301 MBE is employed to grow in order a Si doped (dopant concentration: $1 \times 10^{18}$ cm$^{-3}$), n type GaAs buffer layer 304a having a thickness of 0.5 µm, a Si doped (dopant concentration: $1 \times 10^{18}$ cm$^{-3}$), n type AlGaAs clad layer 305a having a thickness of 1.5 µm, an active layer 306a having a quantum well structure, a Be doped (dopant concentration: $2 \times 10^{18}$ cm$^{-3}$), p type AlGaAs clad layer 307a having a thickness of 1.5 µm, and a Be doped (dopant concentration: $5 \times 10^{18}$ cm$^{-3}$), p type GaAs cap layer 308a having a thickness of 0.5 µm. Note that active layer 306a is formed of a well layer and a barrier layer deposited alternately. For example, three nondoped GaAs well layers each having a thickness of 10 nm and four nondoped AlGaAs barrier layers each having a thickness of 10 nm are deposited such that one type of layer is deposited on the other type of layer. Note that the above semiconductor layers are grown under a condition allowing the substrate to have a temperature of no less than 500° C. to less than 640° C.

Figure 7B:
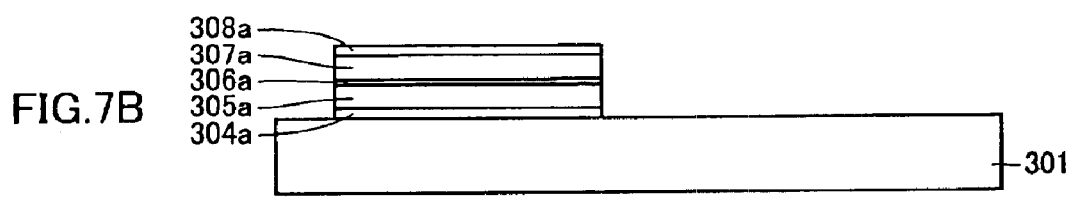

Then, with reference to FIG. 7B, outside the growth furnace the semiconductor layers thus grown are partially etched away to partially expose a surface of substrate 301.

Figure 7C:
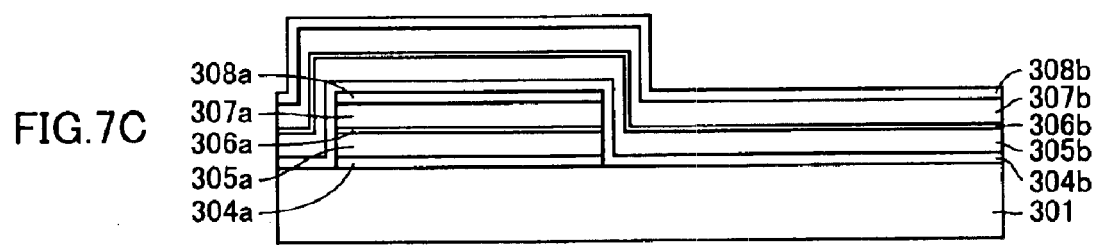

Then, as shown in FIG. 7C, MOCVD is employed to grow on substrate 301 a Si doped (dopant concentration: $1 \times 10^{18}$ cm$^{-3}$), n type GaAs buffer layer 304b having a thickness of 0.5 µm, a Si doped (dopant concentration: $1 \times 10^{18}$ cm$^{-3}$), n type AlGaInP clad layer 305b having a thickness of 1.5 µm, an active layer 306b having a quantum well structure, a Zn doped (dopant concentration: $2 \times 10^{18}$ cm$^{-3}$), p type AlGaInP clad layer 307b having a thickness of 1.5 µm, and a Zn doped (dopant concentration: $5 \times 10^{18}$ cm$^{-3}$), p type GaAs cap layer, 308b having a thickness of 0.5 µm, in order. Note that active layer 306b is formed of a well layer and a barrier layer deposited alternately. For example, three nondoped GaInP well layers each having a thickness of 10 nm and four nondoped AlGaInP barrier layers each having a thickness of 10 nm are deposited such that one type of layer is deposited on the other type of layer. Note that the semiconductor layers are grown under a condition allowing the substrate to have a temperature of no less than 640° C. to no more than 800° C.

Figure 7D:
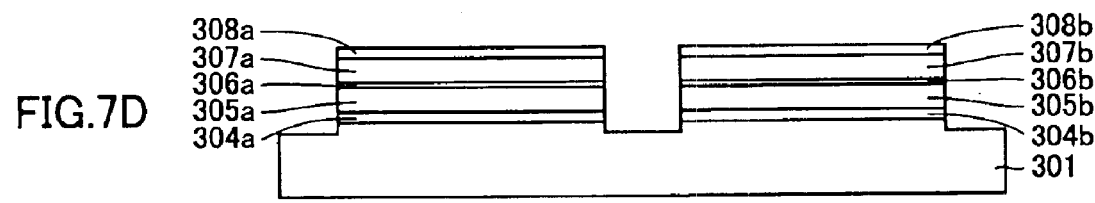

Then, as shown in FIG. 7D, again on substrate 301 the semiconductor layers are partially etched away to partially expose a surface of substrate 301.

Figure 7E:
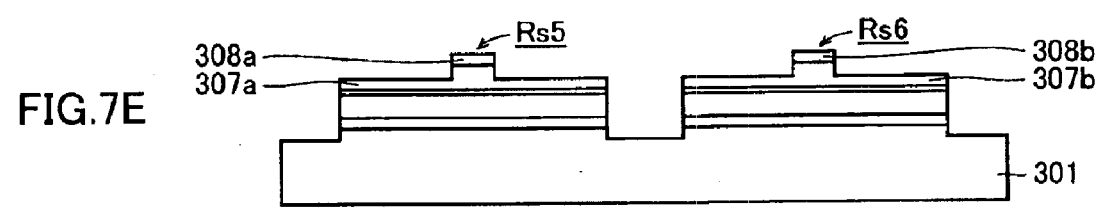

Then, as shown in FIG. 7E, clad layer 307a and cap layer 308a, and clad layer 307b and cap layer 308b are partially etched away to form ridges Rs5 and Rs6.

Figure 7F:
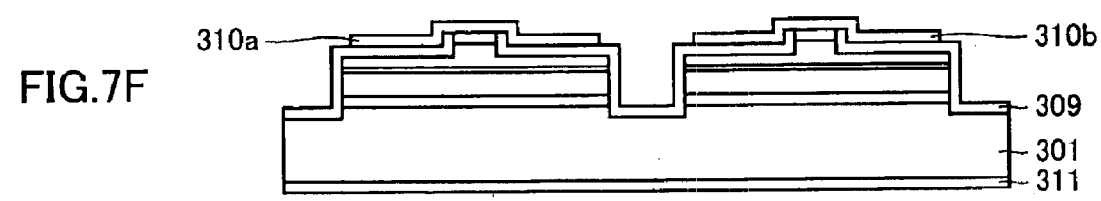

Then, as shown in FIG. 7F, to prevent a current from flowing in from other than ridges Rs5 and Rs6, an insulation film 309 of silicon nitride is provided, on ridges Rs5 and Rs6 insulation film 309 is partially removed, and p type electrodes 310a, 310b are then formed. P type electrodes 310a, 310b are formed for example of an AuZn layer, a Mo layer and an Au layer deposited in order. More specifically, the electrodes are formed by partially etching away the metal layers for the p type electrodes to prevent short circuit between the two laser portions. Furthermore, an n type electrode 311 is provided on substrate 301 at a back surface, i.e., a surface opposite to that for crystal growth. N type electrode 311 is formed for example of an AuGe layer, a Ni layer, a Mo layer and an Au layer deposited in order.

Figure 8:
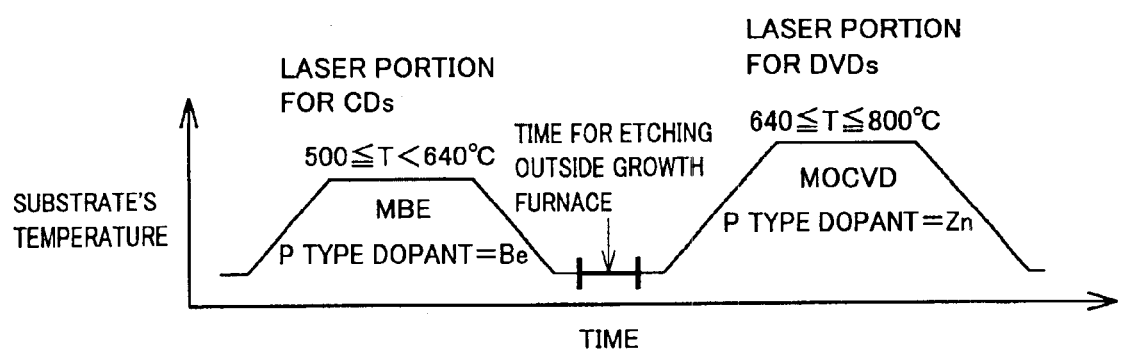
FIG. 8 represents a relationship between time and a substrate's temperature in the process for fabricating the semiconductor laser device of the third embodiment.

As shown in FIG. 8, in the third embodiment when the laser portion for DVDs is subsequently formed the substrate has a temperature higher than when the laser portion for CDs is initially formed. However, as the initially formed laser portion for CDs has p type dopant having a small diffusion coefficient, Be, introduced therein, the dopant's diffusion can be reduced. This, as compared with doping the laser portions with p type dopant of Zn, as conventional, can reduce the semiconductor laser device's threshold current, operating current and the like, providing increased light emission efficiency.

Fourth Embodiment

In a fourth embodiment a semiconductor laser device having the same structure as that in the third embodiment shown in FIG. 6 is fabricated by a method different from that employed in the third embodiment.

The fourth embodiment is characterized in that a laser portion (with p type dopant of Zn) for DVDs is initially formed by MOCVD and a laser portion (with p type dopant of Be) for CDs is then formed by MBE.

Figure 9A:
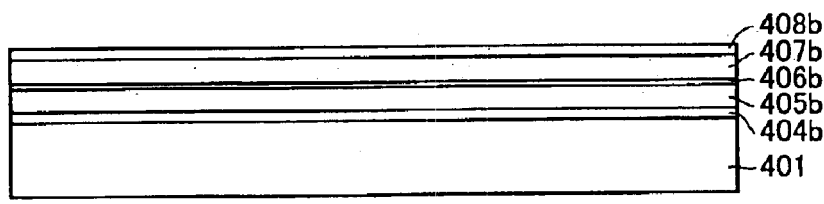
FIGS. 9A–9F are schematic cross sections illustrating a process for fabricating the semiconductor laser device of a fourth embodiment.

More specifically, initially with reference to FIG. 9A, on an n type GaAs substrate 401 MOCVD is employed to grow in order a Si doped (dopant concentration: $1\times10^{18}$ cm$^{-3}$), n type GaAs buffer layer 404b having a thickness of 0.5 $\mu$m, a Si doped (dopant concentration: $1\times10^{18}$ cm$^{-3}$), n type AlGaInP clad layer 405b having a thickness of 1.5 $\mu$m, an active layer 406b having a quantum well structure, a Zn doped (dopant concentration: $2\times10^{18}$ cm$^{-3}$), p type AlGaInP clad layer 407b having a thickness of 1.5 $\mu$m, and a Zn doped (dopant concentration: $5\times10^{18}$ cm$^{-3}$), p type GaAs cap layer 408b having a thickness of 0.5 $\mu$m. Note that active layer 406b is formed of a well layer and a barrier layer deposited alternately. For example, three nondoped GaInP well layers each having a thickness of 10 nm and four nondoped AlGaInP barrier layers each having a thickness of 10 nm are deposited such that one type of layer is deposited on the other type of layer. Note that the above semiconductor layers are grown under a condition allowing the substrate to have a temperature of no less than 640° C. to no more than 800° C.

Figure 9B:
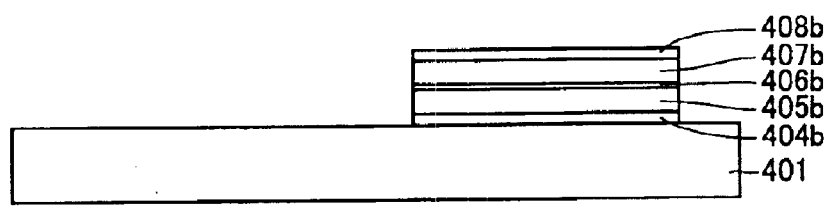

Then, with reference to FIG. 9B, outside the growth furnace the semiconductor layers thus grown are partially etched away to partially expose a surface of substrate 401.

Figure 9C:
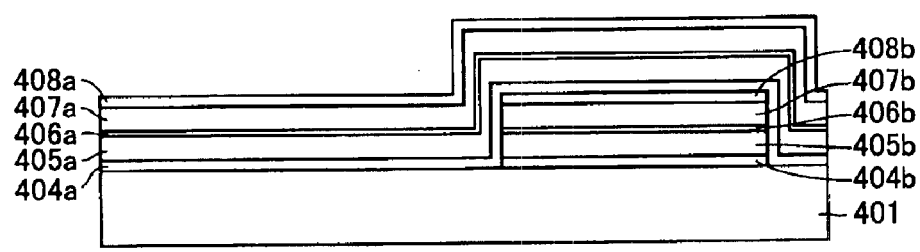

Then, as shown in FIG. 9C, MBE is employed to grow on substrate 401 a Si doped (dopant concentration: $1\times10^{18}$ cm$^{-3}$), n type GaAs buffer layer 404a having a thickness of 0.5 $\mu$m, a Si doped (dopant concentration: $1\times10^{18}$ cm$^{-3}$), n type AlGaAs clad layer 405a having a thickness of 1.5 $\mu$m, an active layer 406a having a quantum well structure, a Be doped (dopant concentration: $2\times10^{18}$ cm$^{-3}$), p type AlGaAs clad layer 407a having a thickness of 1.5 $\mu$m, and a Be doped (dopant concentration: $5\times10^{18}$ cm$^{-3}$), p type GaAs cap layer 408a having a thickness of 0.5 $\mu$m, in order. Note that active layer 406a is formed of a well layer and a barrier layer deposited alternately. For example, three nondoped GaAs well layers each having a thickness of 10 nm and four nondoped AlGaAs barrier layers each having a thickness of 10 nm are deposited such that one type of layer is deposited on the other type of layer. Note that the semiconductor layers are grown under a condition allowing the substrate to have a temperature of no less than 500° C. to less than 640° C. The DVD laser portion's Zn diffusion can thus be reduced.

Figure 9D:
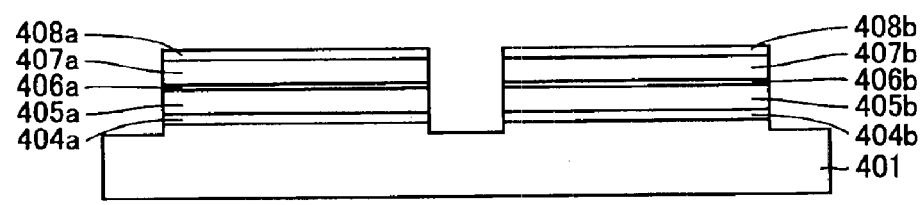

Then, as shown in FIG. 9D, again on substrate 401 the semiconductor layers are partially etched away to partially expose a surface of substrate 401.

Figure 9E:
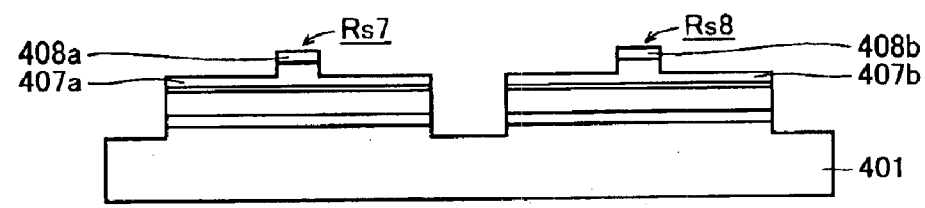

Then, as shown in FIG. 9E, clad layer 407a and cap layer 408a, and clad layer 407b and cap layer 408b are partially etched away to form ridges Rs7 and Rs8.

Figure 9F:
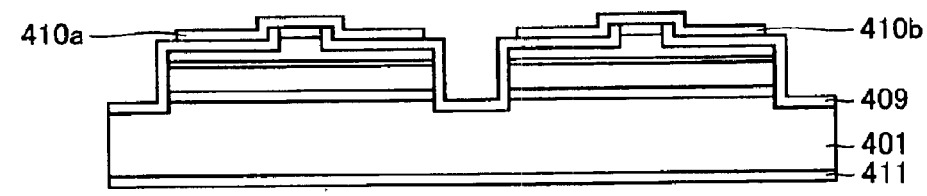

Then, as shown in FIG. 9F, to prevent a current from flowing in from other than ridges Rs7 and Rs8, an insulation film 409 of silicon nitride is provided, on ridges Rs7 and Rs8 insulation film 409 is partially removed, and p type electrodes 410a, 410b are then formed. P type electrodes 410a, 410b are formed for example of an AuZn layer, a Mo layer and an Au layer deposited in order. More specifically, the electrodes are formed by partially etching away the metal layers for the p type electrodes to prevent short circuit between the two laser portions. Furthermore, an n type electrode 411 is provided on substrate 401 at a back surface, i.e., a surface opposite to that for crystal growth. N type electrode 411 is formed for example of an AuGe layer, a Ni layer, a Mo layer and an Au layer deposited in order.

Figure 10:
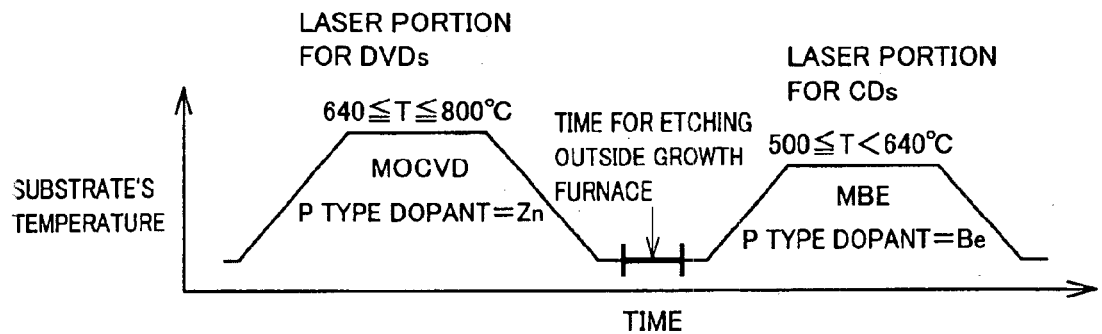
FIG. 10 represents a relationship between time and a substrate's temperature in the process for fabricating the semiconductor laser device of the fourth embodiment.
Figure 11:
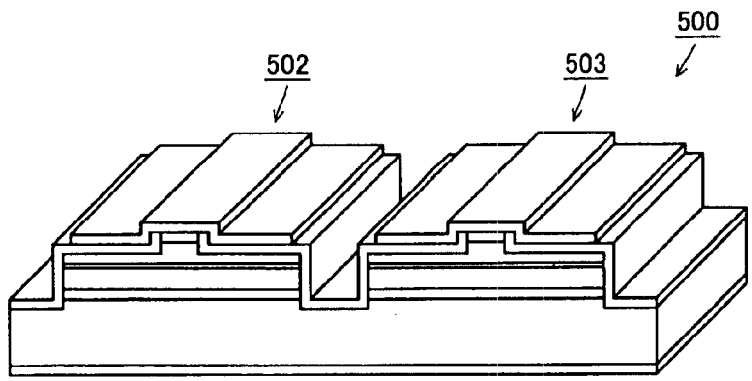
FIG. 11 is a schematic, perspective view of a conventional semiconductor laser device.
Figure 12:
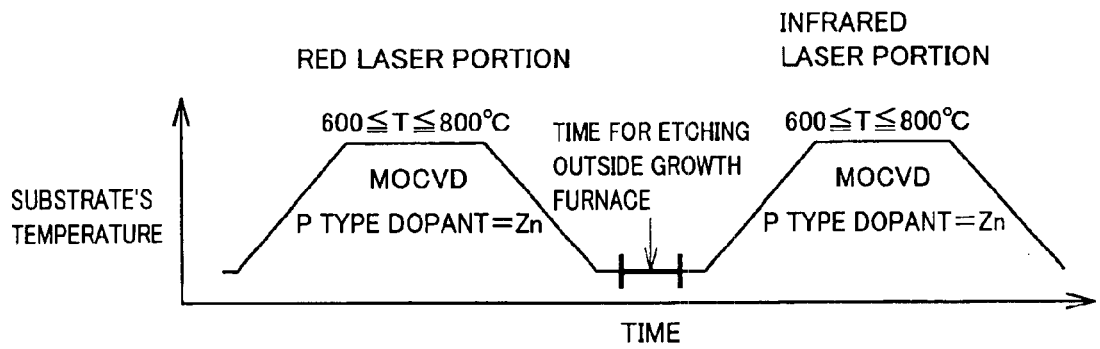
FIG. 12 represents a relationship between time at a substrate's temperature in a process for fabricating the conventional semiconductor laser device.

As shown in FIG. 10, in the fourth embodiment, initially a laser portion for DVDs is formed by MOCVD and subsequently that for CDs is formed by MBE with the substrate having a lower temperature. This, as compared with forming both laser portions by MOCVD with the substrate having a high temperature, as conventional, can reduce diffusion of Zn in the laser portion for DVDs. The semiconductor laser device's threshold current, operating current and the like can be reduced, providing increased light emission efficiency.

Note that while the first to fourth embodiments employ p type dopant of Zn, it may be replaced with C or Mg.

Furthermore while the first to fourth embodiments employ a waveguide structure provided by a ridge waveguide, a variation in index of refraction by ion injection may be utilized or the ridge may be sandwiched between an embedded layer.

Furthermore while the first to fourth embodiments employ an n type GaAs substrate, an insulative substrate may also be used if there is provided a structure allowing a current to be introduced into an active layer.

Furthermore while the first to fourth embodiments provide on a single substrate a red laser portion for DVDs and an infrared laser portion for CDs for a total of two types of laser portions to provide a semiconductor laser device, a laser portion oscillating blue laser light or the like may also be provided on the same substrate to provide laser portions oscillating three or more types of laser light of different wavelengths.

The first to fourth embodiments have been described in conjunction mainly with p type dopant. For n type dopant, from the fact that Si is used for both laser portions n type dopant diffusion is considered to be small, and p type dopant diffusion is a more important issue to be solved.

Thus the present invention can provide a semiconductor laser device allowing a laser portion to have a satisfactory laser characteristic to provide increased production yields, and a method of fabricating the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor laser device, forming a plurality of laser portions on a single substrate, each of the laser portions oscillating laser light of a different wavelength, wherein a laser portion previously formed and a laser portion subsequently formed are formed by different crystal growth methods, respectively, and further, wherein the laser portion previously formed contains p type dopant having a diffusion coefficient smaller than that of p type dopant in the laser portion subsequently formed.

2. The method of claim 1, wherein one of the crystal growth methods is metal-organic chemical vapor deposition.

3. The method of claim 2, wherein one of the crystal growth methods is molecular beam epitaxy.

4. The method of claim 1, the laser portion previously formed is grown by molecular beam epitaxy.

5. The method of claim 1, wherein the laser portion previously formed contains p type dopant of beryllium.

6. The method of claim 5, wherein the laser portion subsequently formed contains p type dopant of one of zinc, carbon or magnesium.

7. The method of claim 1, wherein maximum and minimum temperatures of a substrate in growing a crystal for the laser portion previously formed is respectively higher than those of the substrate in growing a crystal for the laser portion subsequently formed.

8. The method of claim 7, wherein the minimum temperature of the substrate in growing the crystal for the laser portion previously formed is higher than the maximum temperature of the substrate in growing the crystal for the laser portion subsequently formed.

9. The method of claim 7, wherein for the laser portion previously formed a crystal is grown by metal-organic chemical vapor deposition.

10. The method of claim 7, wherein the laser portion previously formed contains p type dopant of one of zinc, carbon or magnesium.

11. The method of claim 7, wherein the laser portion subsequently formed contains p type dopant of beryllium.

12. The method of claim 1, wherein the laser portion previously formed is formed mainly of an AlGaAs based crystal and the laser portion subsequently formed is formed mainly of an AlGaInP based crystal.

13. The method of claim 1, wherein the laser portion previously formed is formed mainly of an AlGaInP based crystal and the laser portion subsequently formed is formed mainly of an AlGaAs based crystal.

* * * * *